(12) United States Patent
Zhang et al.

(10) Patent No.: US 6,955,992 B2
(45) Date of Patent: Oct. 18, 2005

(54) ONE MASK PT/PCMO/PT STACK ETCHING PROCESS FOR RRAM APPLICATIONS

(75) Inventors: Fengyan Zhang, Vancouver, WA (US); Sheng Teng Hsu, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 43 days.

(21) Appl. No.: 10/677,008

(22) Filed: Sep. 30, 2003

(65) Prior Publication Data

US 2005/0079727 A1 Apr. 14, 2005

(51) Int. Cl.$^7$ .................. H01L 21/302; H01L 21/461
(52) U.S. Cl. ................ 438/734; 438/735; 438/736; 438/742; 438/754; 438/785
(58) Field of Search .................. 438/781, 782, 438/785, 789, 790, 734, 735, 736, 742, 754

(56) References Cited

U.S. PATENT DOCUMENTS 6,774,004 B1 * 8/2004 Hsu et al. .................. 438/382
6,774,054 B1 * 8/2004 Zhang et al. ............... 438/781
6,858,905 B2 * 2/2005 Hsu et al. .................. 257/385

OTHER PUBLICATIONS

Lee et al., *Dry Etching to Form Submicron Features in CMR Oxides: PrBaCaMnO$_3$ and LaSr MnO$_3$*, http://mse.ufl.edu/spear/recent_papers/cmr_oxides/cmr_oxides.pdf.

* cited by examiner

Primary Examiner—David Nelms
Assistant Examiner—Renee R. Berry
(74) Attorney, Agent, or Firm—David C. Ripma; Joseph P. Curtin

(57) ABSTRACT

A method of dry etching a PCMO stack, includes preparing a substrate; depositing a barrier layer; depositing a bottom electrode; depositing a PCMO thin film; depositing a top electrode; depositing a hard mask layer; applying photoresist and patterning; etching the hard mask layer; dry etching the top electrode; dry etching the PCMO layer in a multi-step etching process; dry etching the bottom electrode; and completing the PCMO-based device.

17 Claims, 2 Drawing Sheets

ONE MASK PT/PCMO/PT STACK ETCHING PROCESS FOR RRAM APPLICATIONS

FIELD OF THE INVENTION

This invention relates to a Pt/PCMO ($Pr_{1-x}Ca_xMnO_3$)/Pt stack dry etching process for RRAM (Resistor Random Access Memory) applications, although the method of the invention may also be used in fabrication of DRAMs, capacitors, sensors, optical displays, optical switches, transducers, imagers and other magnetic devices.

BACKGROUND OF THE INVENTION

PCMO metal oxide is very hard to etch by a dry etch process. PCMO etching has been reported to include use of chlorine and argon, however, the etch rate is too low for commercial applications, and the masks used in the processes are unstable, and do not remain intact. It is also reported that PCMO has been sputter etched using pure argon, however, many of the same problems arise, in that selectivity of the etch of the PCMO thin film is poor when compared to the mask material and any underlying layers. Lee et al., *Dry Etching to Form Submicron Features in CMR Oxides: PrBaCaMnO_3 and LaSr MnO_3*, which is available at mse.ufl.edu/~spear/recent_papers/cmr_oxides/cmr_oxides.pdf.

SUMMARY OF THE INVENTION

A method of dry etching a PCMO stack, includes preparing a substrate; depositing a barrier layer; depositing a bottom electrode; depositing a PCMO thin film; depositing a top electrode; depositing a hard mask layer; applying photoresist and patterning; etching the hard mask layer; dry etching the top electrode; dry etching the PCMO layer in a multi-step etching process; dry etching the bottom electrode; wherein the dry etching includes an etching chemistry including Ar, $O_2$, and a Cl-containing gas; and completing the PCMO-based device.

It is an object of this invention is to provide a method of dry etching a Pt/PCMO/Pt stack.

Another object of the invention is to dry etch a Pt/PCMO/Pt stack using a single hard mask to provide a clean sidewall and field.

A further object of the invention is to provide a method of dry etching a Pt/PCMO/Pt stack which exhibits high selectivity over the hard mask and underlying layer for RRAM applications, and specifically for fabrication of an RRAM using having a PCMO or doped PCMO thin film therein.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The method of the invention provides a techniques for dry etching a PCMO-based device using a single masking step.

Figure 1:
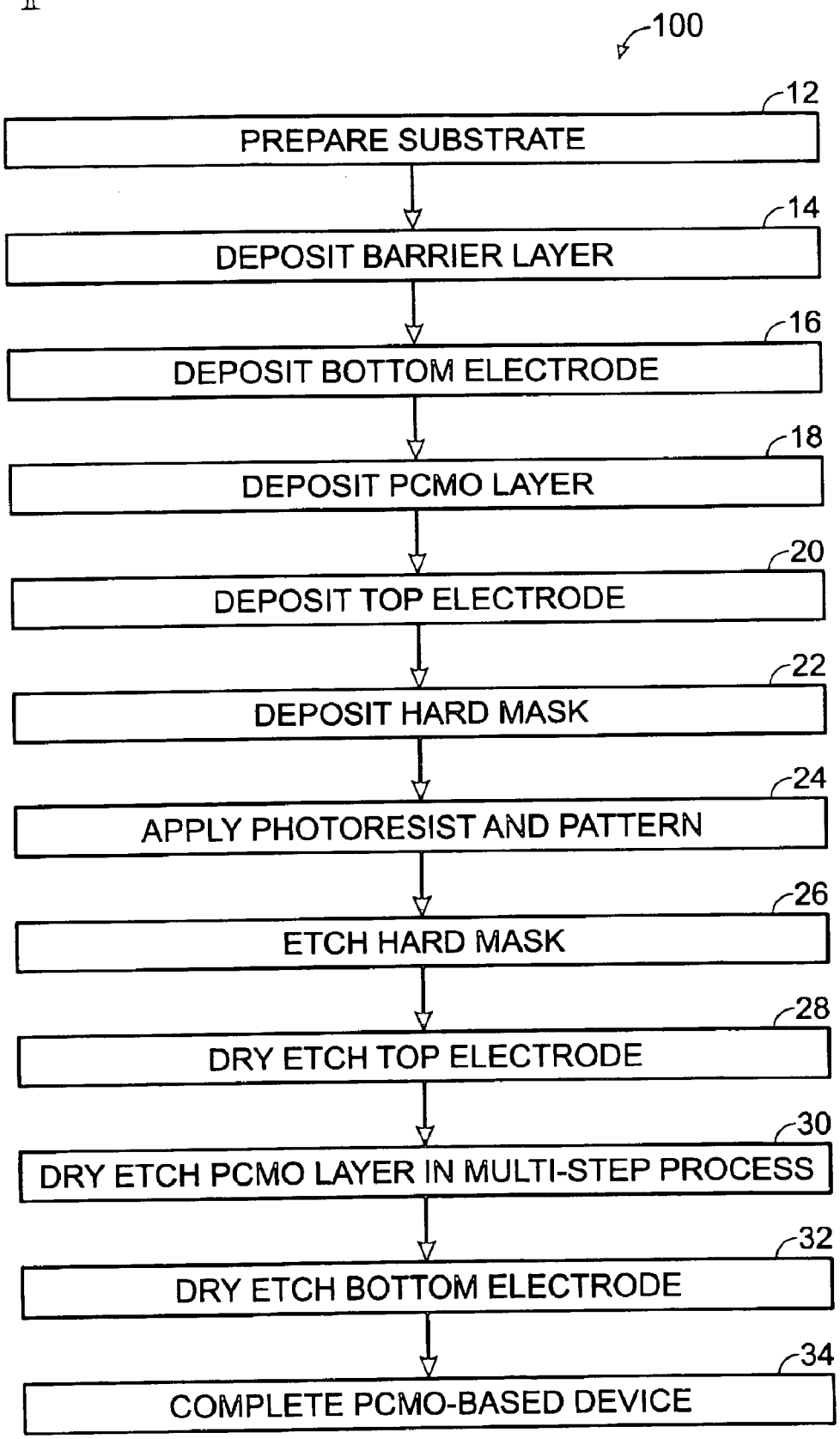
FIG. 1 is a block diagram of the method of the invention.

Referring to FIG. 1, the method of the invention is depicted generally at 10. The initial step of the method of the invention is to prepare a suitable substrate, which may be silicon, silicon dioxide or polysilicon, and which may have a number of structures formed thereon, block 12. A barrier layer is deposited on the substrate, block 14, which barrier layer material is taken from the group of materials consisting of Ta, TaN, Ti, TiN, TiAlN, TiSiN, TaSiN, or TiAl. A bottom electrode is fabricated, block 16, on the barrier layer, using a material taken from the group of materials consisting of platinum, iridium, ruthenium, and oxides of iridium and ruthenium, such as IrO2, RuO2, or a $Y_xBa_2Cu_3O_{7-x}$ (YBCO), to a thickness of between about 30 nm to 500 nm. A $Pr_xCa_{1-x}MnO_3$ (PCMO) thin film is deposited, block 18, on the bottom electrode, to a thickness of between about 10 nm to 500 nm. A top electrode formed of material taken from the group of material consisting of Pt, Ir, Ru or their conducting oxide is deposited on the PCMO thin film, block 20, and has a thickness in the range of between about 10 nm–300 nm. A hard mask, such as TiN, TiO2, Ta, TaN, TiAlN, TiSiN, TaSiN, or TiAl, is deposited on the top electrode, block 22. The thickness of the hard mask is between about 10 nm to 300 nm. A thin layer of Ti, having a thickness in the range of between about 5 nm to 50 nm may be used to enhance the adhesion between the top electrode and the hard mask, in a modified embodiment of the method of the invention. Photoresist is then deposited on the hard mask and developed with the requisite patterns, block 24. After the hard mask is etched, block 26, using conventional techniques, the photoresist is striped and the wafer is ready for dry Pt/PCMO/Pt stack etching.

The top electrode may be dry etched according to the method of the invention through use of a gas mixture of Ar, $O_2$, and $Cl_2$, block 28. The $Cl_2$ gas may be replaced by $BCl_3$, $CCl_4$, $SiCl_4$, or a combination thereof. The total gas flow rate is between about 20 sccm to 100 sccm, and has a preferred flow rate of between about 40 sccm to 70 sccm. The process pressure is between about 1 mTorr and 50 mTorr, and has a preferred value of between about 1 mTorr to 10 mTorr. Microwave power is between about 400 W to 1000 W, and the substrate RF bias power is between about 10 W to 1000 W. The substrate temperature is maintained between about −50° C. to 500° C. The percentage of the oxygen in the gas chemistry is in the range of between about 1% to 50% and has a preferred range of between about 5% to 30%. The percentage of Ar in the gas chemistry is in the range of between about 5% to 80%, and a preferred range of between about 40% to 80%. The remaining gas component is comprised of $Cl_2$.

After the top electrode is etched, the same process may be used to etch the PCMO layer, block 30, however, for PCMO etching, a two step, or a multiple step, etching process has been found to provide better results. In the first etching step, Ar and $O_2$ and a chlorine-containing gas comprise the etching chemistry, which is used to remove most of the PCMO thin film. The same etching process and parameters are used for the first PCMO etch step as was used for etching the top electrode. In the second etching step, Ar and $O_2$ comprise the etching chemistry, which is used to remove the rest of the PCMO thin film. These two steps may be alternately applied in repeated cycles provided that shorter etching times are used in each step. The Ar, $Cl_2$ and $O_2$ etching chemistry provides a higher etch rate than when using only Ar and $O_2$ only ambient, however, using only Ar and $O_2$ provides for a cleaner side wall and field than when all three gases are used in the etching chemistry, thus resulting in a device that has a better throughput rate, and exhibits more reliable performance characteristics that if only a single step etching process were used on the PCMO, as is done in the prior art. The parameters for the second PCMO etching step are the same as for the first step, with the elimination of the chlorine-containing gas, thus, 100% of the gas mixture is argon and oxygen. After etching of the PCMO layer is complete, the bottom electrode may be etched using the same process as used to etch the top electrode, block 32. The PCMO-containing device is then completed, block 34.

The dry etching method of the invention may be applied to Ir/PCMO/Ir, Ru/PCMO/Ru, IrO2/PCMO/IrO2, and RuO2/PCMO/RuO2 capacitors. After Pt/PCMO/Pt stack of the capacitor is etched, a TiN hard mask and a barrier layer may be etched using conventional, state-of-the-art etching techniques. It is preferred to use the same material for both the hard mask and the barrier layer, at about the same thickness range, such as Ti/TiN/Pt (bottom electrode)/PCMO/Pt (top electrode)/Ti/TiN stack, which allows for the hard mask and the barrier layer to be etched away in a single etching step. Otherwise, if dissimilar materials are used, multiple masking and etching step may be needed to accomplish the desired results.

In another embodiment of the method of the invention, a TiN hard mask layer may remain on the top electrode, if required for the completed device. In another embodiment, the barrier layer may be patterned before the bottom electrode is formed, thus eliminating the need for a separate barrier layer removal step.

Figure 2:
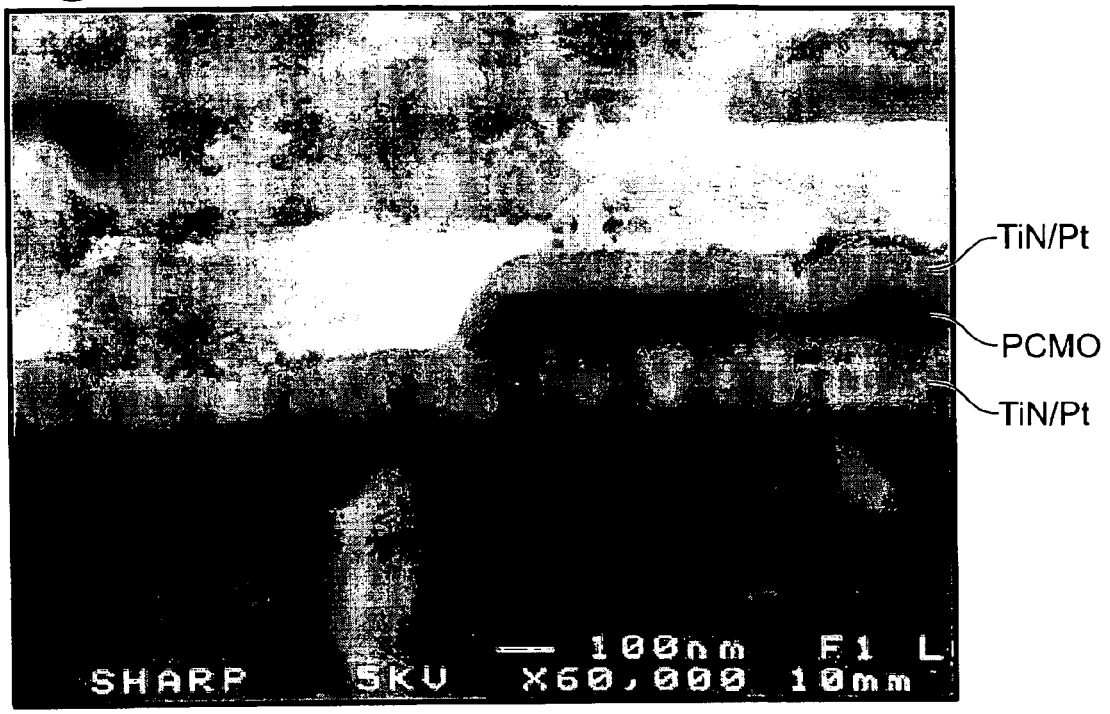
FIGS. 2 and 3 depicts etching profiles of a TiN/Pt/PCMO/Pt/Ti/Si stack.
Figure 3:
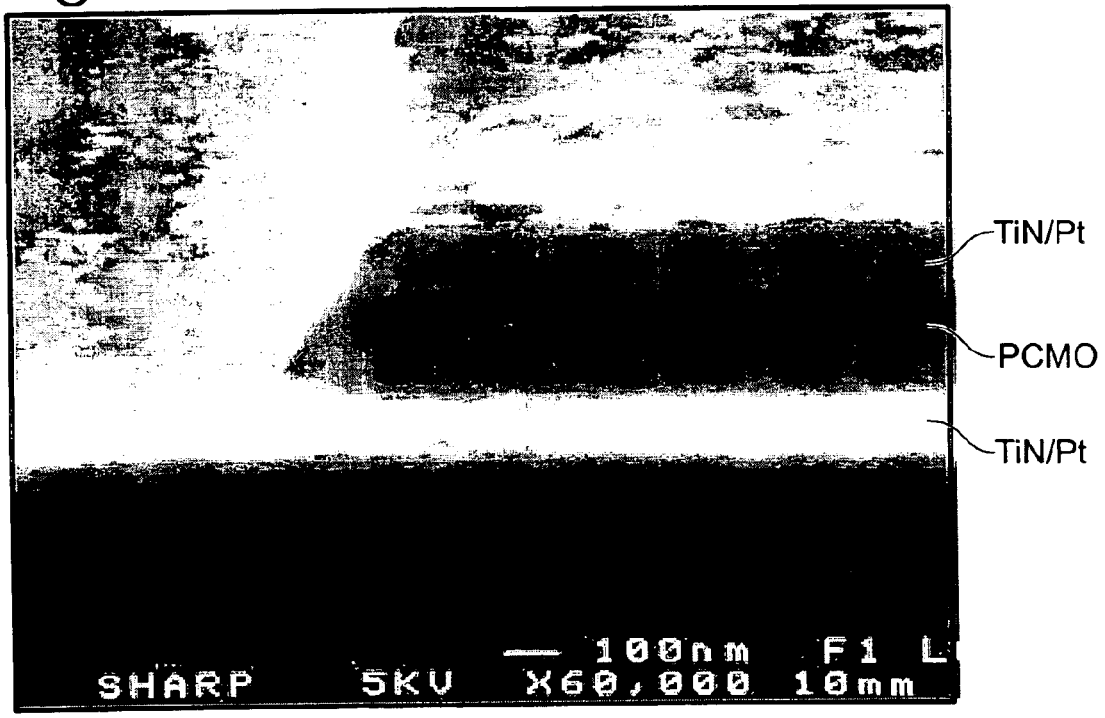

FIGS. 2 and 3 depict examples of structures fabricated according to the method of the invention. The dry etching system may be performed in any state-of-the-art, high-density plasma reactor. An example of such a reactor is an ECR (Electron Cyclotron Resonance) plasma reactor. In this case, the ion density and ion energy in the plasma are controlled independently by adjusting the ECR microwave power and the RF bias power. The gas chemistry for FIGS. 2 and 3 is Ar (40–80%), O2 (5%–30%) and $Cl_2$ (30–50%). The process pressure is 1 mTorr to 10 mTor. The microwave power is at between 500 W to 800 W, and the RF bias power is at 100 W to 400 W. The etching was done in three steps. The first step is etching the Pt top electrode using $Cl_2$, Ar and $O_2$ ambient; the second step is etching the PCMO thin film using alternating cycles: e.g. using $Cl_2+Ar+O_2$ to etch the bulk of PCMO, and then using Ar and $O_2$ for the over etching step with the Ar in a range of between about 90% to 50%, and $O_2$ in a range of between about 10% to 50%, respectively. The third step is etching the bottom electrode using the same process as used to etch the top electrode. The forth step is an optional step, and provides for the etching of the hard mask and the barrier layer using conventional etching techniques. FIG. 2 depicts the etching profile of stack etching of Pt/PCMO stop (Etching profile of TiN (80 nm)/Pt (50 nm)/PCMO (150 nm)/Pt (150 nm)/Ti/Si) on the bottom electrode and FIG. 3 is the stack etching of Pt/PCMO/Pt stop on Ti barrier layer, (Etching profile of TiN (80 nm)/Pt (120 nm)/PCMO (180 nm)/Pt (100 nm)/Ti/Si).

Another variant of the method of the invention is to use TiN, TiO2, Ta, TaN, TiAlN, TiSiN, TaSiN, or TiAl, as the single hard mask to stack etch top electrode/PCMO/bottom electrode, such as Pt/PCMO/Pt.

Thus, a one mask Pt/PCMO/Pt stack etching process for RRAM applications has been disclosed. It will be appreciated that further variations and modifications thereof may be made within the scope of the invention as defined in the appended claims.

We claim:

1. A method of dry etching a PCMO stack, comprising:
preparing a substrate;
depositing a barrier layer;
depositing a bottom electrode;
depositing a PCMO thin film;
depositing a top electrode;
depositing a hard mask layer;
applying photoresist and patterning;
etching the hard mask layer;
dry etching the top electrode;
dry etching the PCMO layer in a multi-step etching process; wherein said dry etching the PCMO layer includes a two-step etching process, wherein the first etching step includes etching the PCMQ layer using a gas mixture of Ar, $O_2$, and a gas taken from the group of gases consisting of $Cl_2$, $BCl_3$, $CCl_4$, $SiCl_4$, and a combination thereof, wherein the percentage of the oxygen is in range of between about 1% to 50%, in a preferred range of between about 5% to 30% the percentage of Ar is in a range of between about 5% to 80%, and in preferred range of between about 40% to 80%; and wherein the remaining gas component consists of a Cl-containing gas, and which further includes providing a gas flow rate of between about 20 sccm to 100 sccm, and a preferred flow rate of between about 40 sccm to 70 sccm; at a pressure of between about 1 mTorr and 50 mTorr, and a preferred pressure of between about 3 mTorr to 10 mTorr at a microwave power of between about 400 W to 1000 W, and a substrate RF bias power is between about 10 W to 1000 W; and at a substrate temperature of between about −50° C. to 500° C.; and wherein the second PCMO etching step includes etching the PCMO layer using a gas mixture consisting Ar and $O_2$, wherein the percentage of the oxygen is in a range of between about 1% to 50%, in a preferred range of between about 5% to 30%; and the percentage of Ar is in a range of between about 5% to 80%, and in a preferred range of between about 40% to 80%; and which further includes providing a gas flow rate of between about 20 sccm to 100 sccm, and a preferred flow rate of between about 40 sccm to 70 sccm; at a pressure of between about 1 mTorr and 50 mTorr, and a preferred pressure of between about 3 mTorr to 10 mTorr; at a microwave power of between about 400 W to 1000 W, and a substrate RF bias power is between about 10 W to 1000 W; and at a substrate temperature of between about −50° C. to 500°°C.;
dry etching the bottom electrode; and
completing the PCMO-based device.

2. The method of claim 1 wherein said dry etching the top electrode includes etching using a gas mixture of Ar, $O_2$, and a gas taken from the group of gases consisting of $Cl_2$, $BCl_3$, $CCl_4$, $SiCl_4$, and a combination thereof, wherein the percentage of the oxygen is in a range of between about 1% to 50%, in a preferred range of between about 5% to 30%; the percentage of Ar is in a range of between about 5% to 80%, and in a preferred range of between about 40% to 80%; and wherein the remaining gas component consists of a Cl-containing gas.

3. The method of claim 2 wherein said dry etching includes providing a gas flow rate of between about 20 sccm to 100 sccm, and a preferred flow rate of between about 40 sccm to 70 sccm; at a pressure of between about 1 mTorr and 50 mTorr, and a preferred pressure of between about 3 mTorr to 10 mTorr, at a microwave power of between about 400 W to 1000 W, and a substrate RF bias power is between about 10 W to 1000 W; and at a substrate temperature of between about −50° C. to 500° C.

4. The method of claim 1 wherein said first etching step and said second etching step are alternately applied until the PCMO is etched.

5. The method of claim 1 wherein said dry etching the bottom electrode includes etching using a gas mixture of Ar, $O_2$, and a gas taken from the group of gases consisting of $Cl_2$, $BCl_3$, $CCl_4$, $SiCl_4$, and a combination thereof, wherein the percentage of the oxygen is in a range of between about 1% to 50%, in a preferred range of between about 5% to 30%; the percentage of Ar is in a range of between about 5% to 80%, and in a preferred range of between about 40% to 80%; and wherein the remaining gas component is comprised of a Cl-containing gas.

6. The method of claim 5 wherein said dry etching includes providing a gas flow rate of between about 20 sccm to 100 sccm, and a preferred flow rate of between about 40 sccm to 70 sccm; at a pressure of between about 1 mTorr and 50 mTorr, and a preferred pressure of between about 3 mTorr to 10 mTorr; at a microwave power of between about 400 W to 1000 W, and a substrate RF bias power is between about 10 W to 1000 W; and at a substrate temperature of between about −50° C. to 500° C.

7. The method of claim 1 which further includes depositing a layer of Ti, having a thickness in the range of between about 5 nm to 50 nm between the top electrode and the hard mask to enhance the adhesion of the hard mask.

8. A method of dry etching a PCMO stack, comprising:
preparing a substrate;
depositing a barrier layer;
depositing a bottom electrode;
depositing a PCMO thin film;
depositing a top electrode;
depositing a hard mask layer;
applying photoresist and patterning;
etching the hard mask layer
dry etching the top electrode;
dry etching the PCMO layer in a multi-step etching process, including a first etching step using an etching chemistry consisting of Ar, $O_2$, and a chlorine-containing gas, and a second etching step uses an etching chemistry consisting of Ar and $O_2$;
dry etching the bottom electrode;
wherein said dry etching of the top electrode, of the bottom electrode and the first PCMO etching step includes etching using a gas mixture of Ar, $O_2$, and a gas taken from the group of gases consisting of $Cl_2$, $BCl_3$, $CCl_4$, $SiCl_4$, and a combination thereof, wherein the percentage of the oxygen is in a range of between about 1% to 50%, in a preferred range of between about 5% to 30%; the percentage of Ar is in a range of between about 5% to 80%, and in a preferred range of between about 40% to 80%; and wherein the remaining gas component is comprised of a Cl-containing gas; and
completing the PCMO-based device.

9. The method of claim 8 wherein said dry etching of the top electrode, of the bottom electrode and the first PCMO etching step includes providing a gas flow rate of between about 20 sccm to 100 sccm, and a preferred flow rate of between about 40 sccm to 70 sccm; at a pressure of between about 1 mTorr and 50 mTorr, and a preferred pressure of between about 3 mTorr to 10 mTorr, at a microwave power of between about 400 W to 1000 W, and a substrate RF bias power is between about 10 W to 1000 W; and at a substrate temperature of between about −50° C. to 500° C.

10. The method of claim 8 wherein the second etching step includes etching the PCMO layer using a gas mixture consisting of Ar and $O_2$, wherein the percentage of the oxygen is in a range of between about 1% to 50%, in a preferred range of between about 5% to 30%; and the percentage of Ar is in a range of between about 5% to 80%, and in a preferred range of between about 40% to 80%; and which further includes providing a gas-flow rate of between about 20 sccm to 100 sccm, and a preferred flow rate of between about 40 sccm to 70 sccm; at a pressure of between about 1 mTorr and 50 mTorr, and a preferred pressure of between about 3 mTorr to 10 mTorr at a microwave power of between about 400 W to 1000 W, and a substrate RF bias power is between about 10 W to 1000 W, and at a substrate temperature of between about −50° C. to 500° C.

11. The method of claim 8 wherein said first etching step and said second etching step are alternately applied until the PCMO is etched.

12. The method of claim 8 which further includes depositing a layer of Ti, having a thickness in the range of between about 5 nm to 50 nm between the top electrode and the hard mask to enhance the adhesion of the hard mask.

13. A method of dry etching a PCMO stack, comprising:
preparing a substrate;
depositing a barrier layer;
depositing a bottom electrode;
depositing a PCMO thin film;
depositing a top electrode;
depositing a hard mask layer;
applying photoresist and patterning;
etching the hard mask layer;
dry etching the top electrode;
dry etching the PCMO layer in a multi-step etching process, including a first etching step using an etching chemistry consisting of Ar, $O_2$ and a chlorine-containing gas, and a second etching step uses an etching chemistry consisting of Ar and $O_2$;
dry etching the bottom electrode; and
completing the PCMO-based device.

14. The method of claim 13 wherein said dry etching of the top electrode, of the bottom electrode and the first PCMO etching step includes etching using a gas mixture of Ar, $O_2$, and a gas taken from the group of gases consisting of $Cl_2$, $BCl_3$, $CCl_4$, $SiCl_4$, and a combination thereof, wherein the percentage of the oxygen is in a range of between about 1% to 50%, in a preferred range of between about 5% to 30%; the percentage of Ar is in a range of between about 5% to 80%, and in a preferred range of between about 40% to 80%; and wherein the remaining gas component is comprised of a Cl-containing gas.

15. The method of claim 14 wherein said dry etching of the top electrode, of the bottom electrode and the first PCMO etching step includes providing a gas flow rate of between about 20 sccm to 100 sccm, and a preferred flow rate of between about 40 sccm to 70 sccm; at a pressure of between about 1 mTorr and 50 mTorr, and a preferred pressure of between about 3 mTorr to 10 mTorr; at a microwave power of between about 400 W to 1000 W, and a substrate RF bias power is between about 10 W to 1000 W; and at a substrate temperature of between about −50° C. to 500° C.

16. The method of claim 13 wherein the second etching step includes etching the PCMO layer using a gas fixture consisting of Ar and $O_2$, wherein the percentage of the oxygen is in a range of between about 1% to 50%, in a preferred range of between about 5% to 30%; and the percentage of Ar is in a range of between about 5% to 80%, and in a preferred range of between about 40% to 80%; and which further includes providing a gas flow rate of between about 20 sccm to 100 sccm, and a preferred flow rate of between about 40 sccm to 70 sccm; at a pressure of between about 1 mTorr and 50 mTorr, and a preferred pressure of between about 3 mTorr to 10 mTorr at a microwave power of between about 400 W to 1000 W, and a substrate RF bias power is between about 10 W to 1000 W; and at a substrate temperature of between about −50° C. to 500° C.

17. The method of claim 13 wherein said first etching step and said second etching step are alternately applied until the PCMQ is etched.

* * * * *